(12) United States Patent
Kim

(10) Patent No.: US 12,153,830 B2
(45) Date of Patent: Nov. 26, 2024

(54) DUAL IN-LINE MEMORY MODULE AND OPERATING METHOD THEREOF

(71) Applicant: SK hynix Inc., Gyeonggi-do (KR)

(72) Inventor: Myoung Seo Kim, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 91 days.

(21) Appl. No.: 17/825,407

(22) Filed: May 26, 2022

(65) Prior Publication Data
US 2023/0221893 A1   Jul. 13, 2023

(30) Foreign Application Priority Data
Jan. 11, 2022 (KR) .......... 10-2022-0003843

(51) Int. Cl.
G06F 3/06 (2006.01)
(52) U.S. Cl.
CPC .......... G06F 3/0659 (2013.01); G06F 3/0604 (2013.01); G06F 3/0619 (2013.01); G06F 3/0653 (2013.01); G06F 3/0679 (2013.01)
(58) Field of Classification Search
None
See application file for complete search history.

(56) References Cited

U.S. PATENT DOCUMENTS

| | | | |
|---|---|---|---|
| 6,507,530 B1* | 1/2003 | Williams | G11C 11/4078 365/226 |
| 8,225,031 B2 | 7/2012 | Lee et al. | |
| 9,513,628 B2 | 12/2016 | Crepet | |
| 10,930,365 B2 | 2/2021 | Poliakov et al. | |
| 11,449,267 B1* | 9/2022 | Rehmeyer | G06F 3/0616 |
| 2007/0191993 A1* | 8/2007 | Wyatt | G11C 5/00 257/E23.08 |
| 2016/0048347 A1* | 2/2016 | Rangarajan | G06F 11/2092 711/156 |
| 2021/0397363 A1* | 12/2021 | Boehm | G06F 11/3409 |

FOREIGN PATENT DOCUMENTS

KR   10-2021-0008712 A   1/2021

* cited by examiner

*Primary Examiner* — Kevin Verbrugge
(74) *Attorney, Agent, or Firm* — IP & T GROUP LLP

(57) ABSTRACT

A DIMM (Dual In-line Memory Module) may include: one or more volatile memories, a nonvolatile memory having a first area where a reference parameter value which is expected to reduce the life expectancy of the volatile memory by a preset range or more, is stored and a second area where an excess counting value is stored, and a control circuit suitable for measuring an operation parameter value of the volatile memory, generating the excess counting value by counting the number of times that the operation parameter value exceeds the reference parameter value, and outputting the excess counting value stored in the second area to the outside through a preset pin in a preset operation mode.

16 Claims, 6 Drawing Sheets

DUAL IN-LINE MEMORY MODULE AND OPERATING METHOD THEREOF

CROSS-REFERENCE TO RELATED APPLICATION

This application claims priority under 35 U.S.C. § 119 to Korean Patent Application No. 10-2022-0003843 filed on Jan. 11, 2022, which is incorporated herein by reference in its entirety.

BACKGROUND

1. Field

Various embodiments of the present disclosure relate to semiconductor design, and more particularly, to a DIMM (Dual In-line Memory Module) capable of monitoring a parameter which has an influence on life expectancy, and an operating method thereof.

2. Discussion of the Related Art

A semiconductor memory device is a memory device which is implemented by a semiconductor such as silicon (Si), germanium (Ge), gallium arsenide (GaAs), indium phosphide (InP) or the like. The semiconductor memory device is roughly classified into a volatile memory device and a nonvolatile memory device.

The volatile memory device is a memory device which loses data stored therein, when a power supply is cut off. Examples of the volatile memory device include an SRAM (Static RAM), DRAM (Dynamic RAM), SDRAM (Synchronous DRAM) and the like. The nonvolatile memory device is a memory device which retains data stored therein, even though the power supply is cut off. Examples of the nonvolatile memory device include a ROM (Read Only Memory), PROM (Programmable ROM), EPROM (Electrically Programmable ROM), EEPROM (Electrically Erasable and Programmable ROM), flash memory, PRAM (Phase-change RAM), MRAM (Magnetic RAM), RRAM (Resistive RAM), FRAM (Ferroelectric RAM) and the like.

For efficient fabrication and improvement in capacitance and performance, most semiconductor memory devices may be commercialized in the form of a required system.

For example, a main memory used in a personal computer, a server or the like may be commercialized in the form of a module which has one or more volatile memory devices integrated on one PCB (Printed Circuit Board), and is mounted in a system through a slot. Among the modules commercialized in the form of a system, the most commonly used module is a DIMM.

The volatile memory device loses data stored therein when an external power supply is cut off, but has a higher read/write speed than the nonvolatile memory device. On the other hand, the nonvolatile memory device may retain data stored therein even though an external power supply is cut off, but has a lower read/write speed than the volatile memory device.

Therefore, the main memory which puts much value on the speed of a memory device may be fabricated in the form of a DIMM including one or more volatile memory devices.

The one or more volatile memory devices included in the DIMM may be each fabricated in the form of one chip, and subjected to a test operation for checking whether the violate memory device normally operates, before the volatile memory device is delivered after fabrication.

By performing the test operation on each of the one or more volatile memory devices included in the DIMM, it is possible to prevent a defective memory device from being included in the DIMM. Furthermore, it is possible to not only set a parameter condition of the DIMM, under which the memory device can be stably operated, but also to predict the life expectancy of the DIMM.

Although the DIMM was delivered after the test operation was performed during the fabrication process, the DIMM may not be used for its life expectancy, but a request for after-sale service may be received. Alternatively, although the DIMM is used for its life expectancy, the operation performance thereof may be significantly degraded. Alternatively, even after the DIMM is used for more than its life expectancy, the operation performance thereof may not be significantly degraded.

In these cases, since the products were already delivered, it is substantially impossible to find out why a DIMM fabricated through a similar process was not used for its life expectancy, the operation performance of the DIMM was significantly degraded even though the DIMM was used for its life expectancy, or the operation performance of the DIMM was not significantly degraded even after the DIMM was used for more than its life expectancy.

SUMMARY

Various embodiments of the present disclosure are directed to a DIMM (Dual In-line Memory Module) which uses a parameter that has an influence on the life expectancy of the DIMM even after the DIMM is delivered, and an operating method thereof.

The problems to be solved by the present disclosure are not limited to the above-mentioned problems, and other unmentioned problems will be clearly understood from the following description by those skilled in the art.

In an embodiment of the present disclosure, a Dual In-line Memory Module (DIMM) may include: one or more volatile memories; a nonvolatile memory having a first area where a reference value of a parameter, which is expected to reduce a life expectancy of the volatile memory by a preset range or longer, is stored and a second area where an excess counting value is stored; and a control circuit suitable for measuring an operation value of the parameter, generating the excess counting value by counting a number of times that the measured operation value exceeds the reference value, and outputting the excess counting value stored in the second area to the outside through a preset pin in a preset operation mode.

In an embodiment of the present disclosure, an operating method of a Dual In-line Memory Module (DIMM) which includes one or more volatile memories and a nonvolatile memory, the operating method may include: storing a reference value of a parameter decided through a test performed at a first time point, in a first area of the nonvolatile memory; measuring, after the first time point, an operation value of the parameter in each preset period until a second time point; storing an excess counting value in a second area of the nonvolatile memory, the excess counting value being obtained by counting a number of times that the measured operation value exceeds the reference value; and outputting the excess counting value stored in the second area to the outside through a preset pin in an operation mode set after the second time point.

In an embodiment of the present disclosure, a testing method of a volatile memory device, the method may include: periodically measuring a value of a parameter to store, in a non-volatile memory device packaged together with the volatile memory device, a number of the measured values each greater than a threshold stored in the non-volatile memory device; and outputting the number. The parameter may be related to one of a temperature, an operating power and a humidity of the volatile memory device.

In accordance with embodiments of the present disclosure, after one or more nonvolatile memories are included in the DIMM including one or more volatile memories, an operation parameter which is monitored while the fabricated and delivered DIMM is mounted and used, may be stored in the one or more nonvolatile memories.

Through the operation parameter, it is possible to check and analyze in which operation environment the fabricated and delivered DIMM has been used.

DETAILED DESCRIPTION

Figure 1:
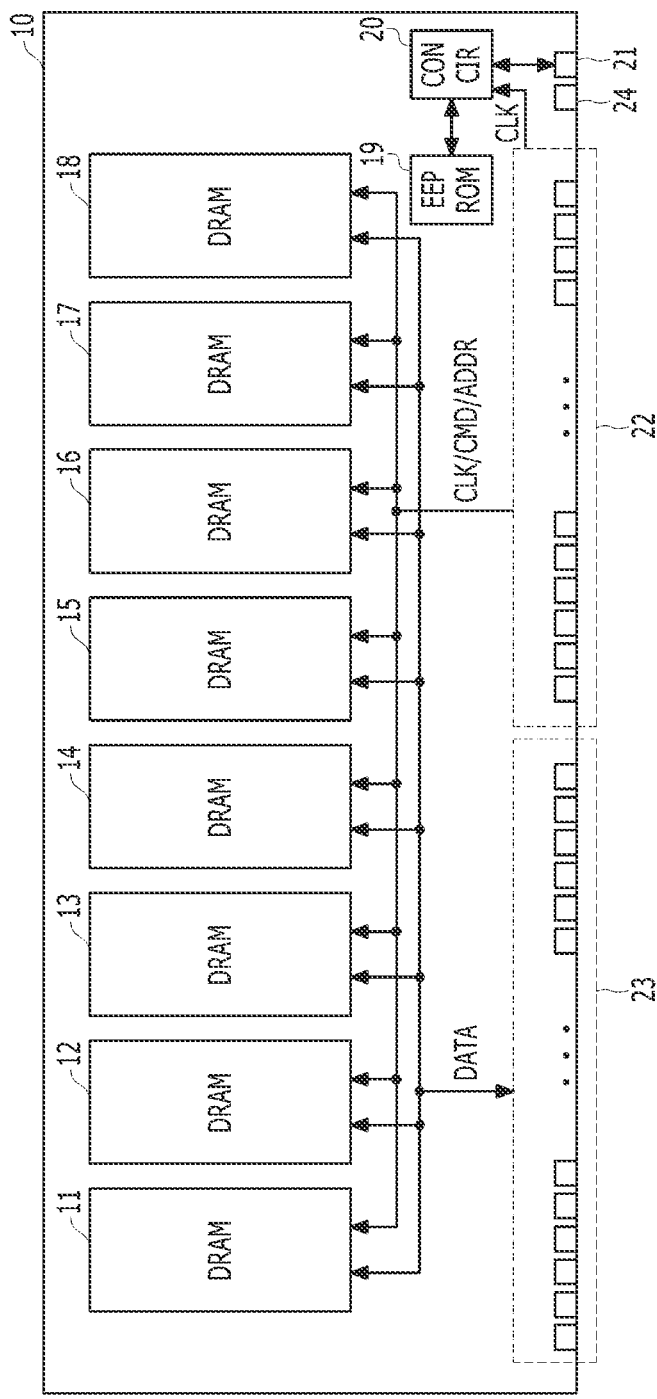
FIG. 1 is a block diagram for describing an example of a DIMM (Dual In-line Memory Module) in accordance with an embodiment of the present disclosure.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language includes hardware, for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used in this disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that the terms precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. For example, the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

FIG. 1 is a block diagram for describing an example of a DIMM (Dual In-line Memory Module) in accordance with an embodiment of the present disclosure.

Referring to FIG. 1, a DIMM 10 in accordance with an embodiment may include one or more volatile memories 11 to 18, one nonvolatile memory 19, and a control circuit 20. Furthermore, the DIMM 10 may further include one or more data input/output pins 23, one or more command/address/clock input pins 22, and one or more dummy pins 21 and 24.

Each of the one or more volatile memories 11 to 18 may be one of an SRAM (Static RAM), DRAM (Dynamic RAM), and SDRAM (Synchronous DRAM). The present embodiment is based on that the volatile memory is a DRAM.

The one nonvolatile memory 19 may be one of a ROM (Read Only Memory), PROM (Programmable ROM), EPROM (Electrically Programmable ROM), EEPROM (Electrically Erasable and Programmable ROM), flash memory, PRAM (Phase-change RAM), MRAM (Magnetic RAM), RRAM (Resistive RAM), and FRAM (Ferroelectric RAM). The present embodiment is based on that the nonvolatile memory is an EEPROM.

The DIMM 10 may store data DATA inputted through the data input/output pin 23 in the one or more volatile memories 11 to 18 included therein, or output the data DATA stored in the one or more volatile memories 11 to 18 included therein through the data input/output pin 23, in response to a command CMD, an address ADDR, and an operation clock CLK, which are transferred through the command/address/clock input pin 22.

The dummy pins 21 and 24 included in the DIMM 10 indicate arbitrary pins which are not used during the process of inputting/outputting the data DATA to/from the one or more volatile memories 11 to 18.

At a first time point that the DIMM 10 is fabricated by a fabricator, a test operation may be performed on each of the DIMM 10 and the one or more volatile memories 11 to 18 included therein. According to the result of the test operation, a reference value of a parameter may be decided, which is expected to reduce, by a predetermined range or longer, the life expectancies of the DIMM 10 and the one or more volatile memories 11 to 18 included therein.

For reference, the test operation may be performed through separate test equipment which are physically distinguished from the DIMM 10 and the one or more volatile memories 11 to 18 included therein.

The reference value decided through the test operation may be stored in a first area of the nonvolatile memory 19 included in the DIMM 10. Then, the DIMM 10 may be delivered to a user.

In an embodiment, the first area of the nonvolatile memory 19 may be a read only area. That is, after the reference value is stored once in the first area of the nonvolatile memory 19 during the process of fabricating the DIMM 10, the stored value can be only read, but cannot be changed (overwritten).

In an embodiment, the reference value may include one or more of a reference temperature value, a reference power value, and a reference humidity value. Therefore, one or more of the reference temperature value, the reference power value and the reference humidity value, which are expected to reduce, by a preset range or longer, the life expectancies of the DIMM 10 and the one or more volatile memories 11 to 18 included therein, may be stored in the first area of the nonvolatile memory 19 at the point of time that the DIMM 10 is delivered to the user.

After the DIMM 10 is fabricated by the fabricator and delivered to a user, the DIMM 10 may be mounted and used by the user. After the DIMM 10 is mounted and sufficiently used, the DIMM 10 may be collected by the fabricator. The point of time that the DIMM 10 which has been mounted and sufficiently used by the user is collected by the fabricator may be a second time point.

The control circuit 20 included in the DIMM 10 may measure an operation value of the parameter, which is expected to reduce, by the predetermined range or longer, the life expectancies of the DIMM 10 and the one or more volatile memories 11 to 18 included therein, in each preset period between the first time point at which the DIMM 10 is fabricated and the second time point at which the DIMM 10 is collected. At this time, the preset period may be defined on the basis of how many times an operation clock CLK inputted to the DIMM 10 toggles. In an embodiment, the operation clock CLK inputted to the DIMM 10 may be a clock which toggles when the DIMM 10 operates in a normal mode, and does not toggle when the DIMM 10 operates in a sleep mode. That is, memory control logic (not illustrated) for controlling the operation of the DIMM 10 may toggle the operation clock CLK in the normal mode where the data DATA needs to be read from/written to the volatile memories 11 to 18 included in the DIMM 10, and may not toggle the operation clock CLK in the sleep mode where the data DATA does not need to be read from/written to the volatile memories 11 to 18 included in the DIMM 10.

Furthermore, the control circuit 20 included in the DIMM 10 may generate an excess counting value obtained by cumulatively counting the number of times that the measured operation value exceeds the reference value stored in the first area of the nonvolatile memory 19, and store the excess counting value in a second area of the nonvolatile memory.

In an embodiment, the second area of the nonvolatile memory 19 may be an overwrite possible area. That is, whenever the excess counting value is increased, the control circuit 20 may overwrite the increased excess counting value to the second area of the nonvolatile memory 19, instead of the existing excess counting value which has been generated and stored in the second area of the nonvolatile memory 19.

For reference, examples of the case in which the DIMM 10 is collected by the fabricator may include the case in which the DIMM 10 is collected by the fabricator due to a request for after-sale service, which was made after an operation fault occurred within the warranty of the fabricator for the DIMM 10, and the case in which the DIMM 10 is collected by the fabricator because the warranty of the fabricator has expired.

At this time, the type of the operation parameter may correspond to the type of the reference parameter. In an embodiment, the operation value may include one or more of an operation temperature value, an operation power value, and an operation humidity value. Similarly, the excess counting value may include one or more of a temperature counting value, a power counting value, and a humidity counting value.

Therefore, one or more of the temperature counting value obtained by cumulatively counting the number of times that the operation temperature value exceeds the reference temperature value in a mounting operation period between the delivery time point and the collection time point for the DIMM 10, the power counting value obtained by cumulatively counting the number of times that the operation power value exceeds the reference power value in the mounting operation period, and the humidity counting value obtained by cumulatively counting the number of times that the operation humidity value exceeds the reference humidity value in the mounting operation period may be stored in the second area of the nonvolatile memory 19 at the point of time that the DIMM 10 is collected from the user.

When entering a preset operation mode after the second time point that the DIMM 10 which has been mounted and sufficiently used by the user is collected by the fabricator, the control circuit 20 included in the DIMM 10 may output the excess counting value, stored in the second area of the nonvolatile memory 19, through a preset pin 21 of the one or more dummy pins 21 and 24. That is, the fabricator may receive the excess counting value, stored in the second area of the nonvolatile memory 19 included in the DIMM 10 which has been mounted and sufficiently used, through the preset pin 21. The fabricator may check to which operation environment the DIMM 10 has been exposed while mounted and used, through the received excess counting value, and analyze the state of the DIMM 10 according to the check result.

In an embodiment, when the temperature counting value stored in the second area of the nonvolatile memory 19 of the DIMM 10 collected after the second time point exceeds 10,000, it may be that the life expectancies of the DIMM 10 and the volatile memories 11 to 18 included therein are hardly left. In another embodiment, when the power counting value stored in the second area of the nonvolatile memory 19 of the DIMM 10 collected after the second time point exceeds 7,000, it may be that the life expectancies of the DIMM 10 and the volatile memories 11 to 18 included therein are hardly left. In still another embodiment, when the humidity counting value stored in the second area of the nonvolatile memory 19 of the DIMM 10 collected after the second time point exceeds 5,000, it may be that the life expectancies of the DIMM 10 and the volatile memories 11 to 18 included therein are hardly left. In yet another embodiment, when a total counting value stored in the second area of the nonvolatile memory 19 of the DIMM 10 collected after the second time point, i.e., a value obtained by summing up two or more counting values of the temperature counting value, the power counting value and the humidity counting value, exceeds 22,000, it may be that the life expectancies of the DIMM 10 and the volatile memories 11 to 18 included therein are hardly left.

When the DIMM 10 is collected by the fabricator because the warranty period of the fabricator for the DIMM 10 has expired even though it was checked as in the above-described embodiment that the life expectancies of the DIMM 10 and the volatile memories 11 to 18 included therein were hardly left, the fabricator may check that the life expectancies thereof were not rapidly reduced even through the DIMM 10 was operated under a severe usage environment, and may adjust the warranty period of the DIMM 10 or alleviate the test condition in the fabrication process, thereby increasing the production yield.

Furthermore, when the DIMM 10 is collected by the fabricator due to a request for after-sale service, which was made after an operation fault occurred within the warranty period of the fabricator for the DIMM 10, even though it was checked unlike the above-described embodiment that the life expectancies of the DIMM 10 and the volatile memories 11 to 18 included therein were left to a certain extent or more, the fabricator may check that the life expectancies thereof were reduced more rapidly than expected, under a severe usage environment, and may adjust the warranty period of the DIMM or secure durability through a more severe test in the fabrication process.

Furthermore, when the DIMM 10 is collected by the fabricator because the warranty period of the fabricator for the DIMM 10 has expired even though it was checked unlike the above-described embodiment that the life expectancies of the DIMM 10 and the volatile memories 11 to 18 included therein were left to a certain extent or more, the fabricator may reuse the collected DIMM 10. For example, the DIMM 10 may be reused in a system which does not require high reliability.

For reference, the control circuit 20 and the nonvolatile memory 19 may be only components which are used by the fabricator to manage the DIMM and have no influence on a normal operation of the DIMM 10, i.e., an operation of reading/writing data from/to the volatile memories 11 to 18. Therefore, the content indicating that the control circuit 20 and the volatile memory 19 are included in the DIMM 10 may not be open to a user. Furthermore, the preset operation mode indicating an operation mode which the DIMM 10 can enter after being collected by the fabricator may not be open to a user.

Figure 2:
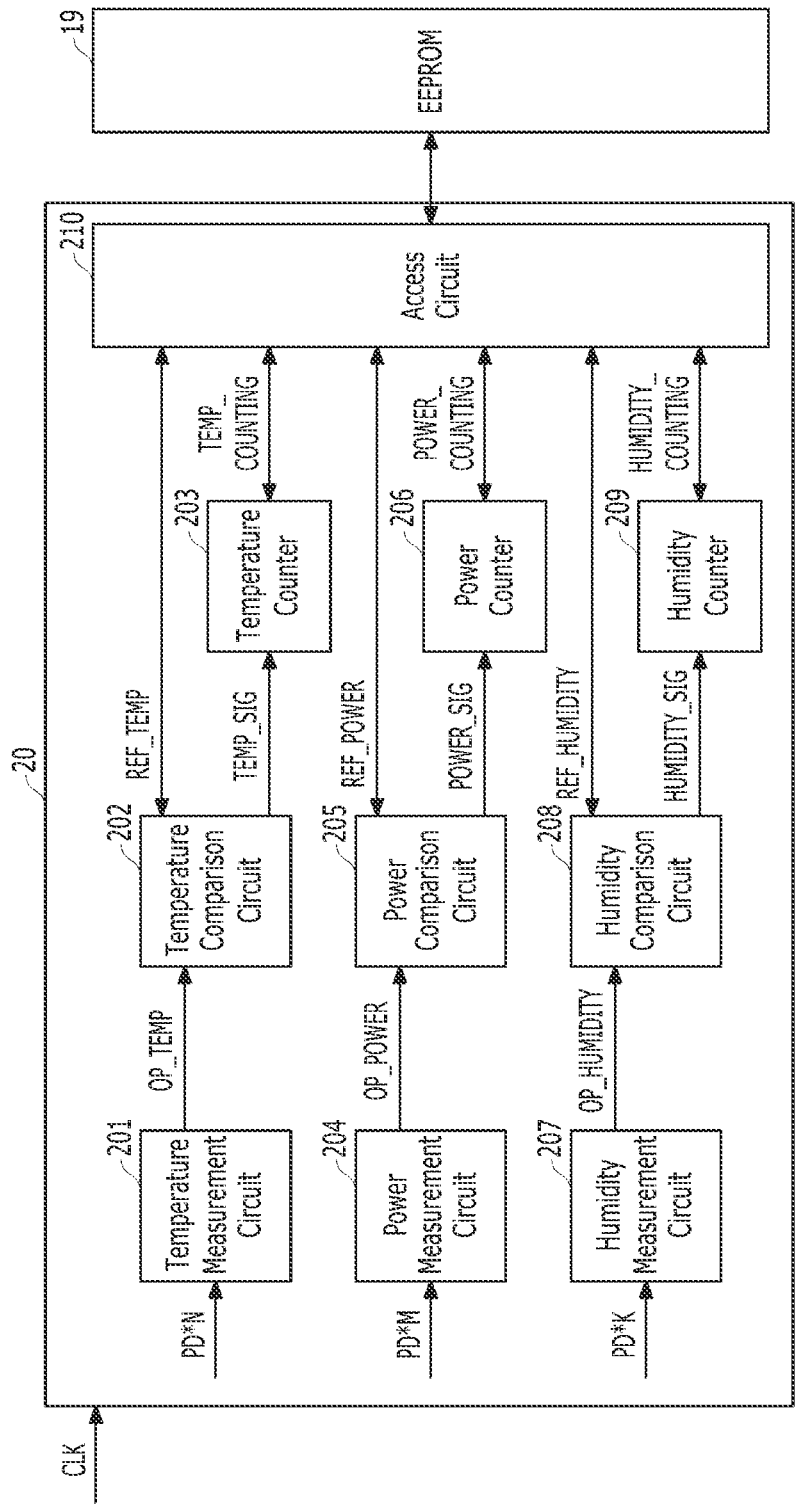
FIG. 2 is a block diagram for describing an example of a control circuit included in the DIMM illustrated in FIG. 1 in accordance with an embodiment of the present disclosure.

FIG. 2 is a block diagram for describing an example of the control circuit included in the DIMM illustrated in FIG. 1 in accordance with an embodiment of the present disclosure.

FIG. 2 illustrates the detailed configuration of the control circuit 20 included in the DIMM 10 described with reference to FIG. 1.

The control circuit 20 may include an operation measurement circuit 201, 204 and 207, a parameter comparison circuit 202, 205 and 208, a counter 203, 206 and 209, and an access circuit 210.

The operation measurement circuit 201, 204 and 207 may measure an operation value OP_TEMP, OP_POWER and OP_HUMIDITY in each preset period between the first time point that the DIMM 10 is delivered to a user and the second time point that the DIMM 10 is collected from the user.

The parameter comparison circuit 202, 205 and 208 may generate a signal TEMP_SIG, POWER_SIG, and HUMIDITY_SIG which toggles when the operation value OP_TEMP, OP_POWER, and OP_HUMIDITY measured by the operation measurement circuit 201, 204 and 207 exceeds a reference value REF_TEMP, REF_POWER, and REF_HUMIDITY stored in the first area of the nonvolatile memory 19.

The counter 203, 206 and 209 may increase an excess counting value TEMP_COUNTING, POWER_COUNTING, and HUMIDITY_COUNTING, whenever the signal TEMP_SIG, POWER_SIG, and HUMIDITY_SIG generated by the parameter comparison circuit 202, 205 and 208 toggles. At this time, the excess counting value TEMP_COUNTING, POWER_COUNTING, and HUMIDITY_COUNTING may be stored in the second area of the nonvolatile memory 19.

The access circuit 210 may read the reference value REF_TEMP, REF_POWER, and REF_HUMIDITY stored in the first area of the nonvolatile memory 19, and transfer the read value to the parameter comparison circuit 202, 205, and 208.

Furthermore, the access circuit 210 may read the excess counting value TEMP_COUNTING, POWER_COUNTING, and HUMIDITY_COUNTING from the second area of the nonvolatile memory 19, transfer the read value to the counter 203, 206 and 209, and then overwrite the excess counting value TEMP_COUNTING, POWER_COUNTING, and HUMIDITY_COUNTING, increased by the counter 203, 206 and 209, to the second area of the nonvolatile memory 19. At this time, before the counter 203, 206 and 209 starts the initial up-counting operation, the access circuit 210 may store the initial value of the excess counting value TEMP_COUNTING, POWER_COUNTING, and HUMIDITY_COUNTING as '0' in the second area of the nonvolatile memory 19.

Furthermore, when entering a preset operation mode after the second time point that the DIMM 10 is collected from a user, the access circuit 210 may output the excess counting value TEMP_COUNTING, POWER_COUNTING, and HUMIDITY_COUNTING, stored in the second area of the nonvolatile memory 19, through the preset pin 21 of the one or more dummy pins 21 and 24.

In an embodiment, the reference value REF_TEMP, REF_POWER, and REF_HUMIDITY may include one or more of a reference temperature value REF_TEMP, a reference power value REF_POWER, and a reference humidity value REF_HUMIDITY. At this time, the type of the operation parameter may correspond to the type of the reference parameter. In an embodiment, the operation value OP_TEMP, OP_POWER, and OP_HUMIDITY may include one or more of an operation temperature value OP_TEMP, an operation power value OP_POWER, and an operation humidity value OP_HUMIDITY. Similarly, the excess counting value TEMP_COUNTING, POWER_COUNTING, and HUMIDITY_COUNTING may include one or more of a temperature counting value TEMP_COUNTING, a power counting value POWER_COUNTING, and a humidity counting value HUMIDITY_COUNTING.

When the types of the parameters are temperature, power and humidity, the control circuit 20 may be embodied as follows.

First, the operation measurement circuit 201, 204 and 207 may include a temperature measurement circuit 201, a power measurement circuit 204, and a humidity measurement circuit 207.

The temperature measurement circuit 201 may generate the operation temperature value OP_TEMP by measuring the current temperature of the DIMM 10 in each N multiples of the preset period (PD*N).

The power measurement circuit 204 may generate the operation power value OP_POWER by measuring a power value which is currently used by the entire one or more volatile memories 11 to 18 included in the DIMM 10 in each M multiples of the preset period (PD*M).

The humidity measurement circuit 207 may generate the operation humidity value OP_HUMIDITY by measuring the current humidity of the DIMM 10 in each K multiples of the preset period (PD*K).

Here, N, M and K each may be a natural number equal to or greater than 1. Furthermore, N, M and K may be set to different values, or two or more of N, M and K may be set to the same value. That is, the temperature measurement circuit 201, the power measurement circuit 204, and the humidity measurement circuit 207 may each perform the measurement operation in a different period, or two or more measurement operations may be performed in the same period.

The parameter comparison circuit 202, 205 and 208 may include a temperature comparison circuit 202, a power comparison circuit 205, and a humidity comparison circuit 208.

The temperature comparison circuit 202 may compare the operation temperature value OP_TEMP generated by the temperature measurement circuit 201 to the reference temperature value REF_TEMP read from the nonvolatile memory 19 through the access circuit 210. The temperature comparison circuit 202 may not toggle the temperature signal TEMP_SIG when the comparison result indicates that the operation temperature value OP_TEMP is equal to or less than the reference temperature value REF_TEMP, but may toggle the temperature signal TEMP_SIG when the comparison result indicates that the operation temperature value OP_TEMP exceeds the reference temperature value REF_TEMP.

The power comparison circuit 205 may compare the operation power value OP_POWER generated by the power measurement circuit 204 to the reference power value REF_POWER read from the nonvolatile memory 19 through the access circuit 210. The power comparison circuit 205 may not toggle the power signal POWER_SIG when the comparison result indicates that the operation power value OP_POWER is equal to or less than the reference power value REF_POWER, but may toggle the power signal POWER_SIG when the comparison result indicates that the operation power value OP_POWER exceeds the reference power value REF_POWER.

The humidity comparison circuit 208 may compare the operation humidity value OP_HUMIDITY generated by the humidity measurement circuit 207 to the reference humidity value REF_HUMIDITY read from the nonvolatile memory 19 through the access circuit 210. The humidity comparison circuit 208 may not toggle the humidity signal HUMIDITY_SIG when the comparison result indicates that the operation humidity value OP_HUMIDITY is equal to or less than the reference humidity value REF_HUMIDITY, but may toggle the humidity signal HUMIDITY_SIG when the comparison result indicates that the operation humidity value OP_HUMIDITY exceeds the reference humidity value REF_HUMIDITY.

The counter 203, 206 and 209 may include a temperature counter 203, a power counter 206, and a humidity counter 209.

The temperature counter 203 may increase the temperature counting value TEMP_COUNTING in response to the temperature signal TEMP_SIG toggled by the temperature comparison circuit 202.

The power counter 206 may increase the power counting value POWER_COUNTING in response to the power signal POWER_SIG toggled by the power comparison circuit 205.

The humidity counter 209 may increase the humidity counting value HUMIDITY_COUNTING in response to the humidity signal HUMIDITY_SIG toggled by the humidity comparison circuit 208.

The access circuit 210 may read the reference temperature value REF_TEMP stored in the first area of the nonvolatile memory 19, and transfer the read value to the temperature comparison circuit 202.

The access circuit 210 may read the reference power value REF_POWER stored in the first area of the nonvolatile memory 19, and transfer the read value to the power comparison circuit 205.

The access circuit 210 may read the reference humidity value REF_HUMIDITY stored in the first area of the nonvolatile memory 19, and transfer the read value to the humidity comparison circuit 208.

Furthermore, the access circuit 210 may read the temperature counting value TEMP_COUNTING stored in the second area of the nonvolatile memory 19, transfer the read value to the temperature counter 203, and then overwrite the temperature counting value TEMP_COUNTING, increased by the temperature counter 203, to the second area of the nonvolatile memory 19.

Furthermore, the access circuit 210 may read the power counting value POWER_COUNTING stored in the second area of the nonvolatile memory 19, transfer the read value to the power counter 206, and then overwrite the power counting value POWER_COUNTING, increased by the power counter 206, to the second area of the nonvolatile memory 19.

Furthermore, the access circuit 210 may read the humidity counting value HUMIDITY_COUNTING stored in the second area of the nonvolatile memory 19, transfer the read value to the humidity counter 209, and then overwrite the humidity counting value HUMIDITY_COUNTING, increased by the humidity counter 209, to the second area of the nonvolatile memory 19.

The access circuit 210 may generate a total counting value TOTAL_COUNTING by summing up two or more of the temperature counting value TEMP_COUNTING, the power counting value POWER_COUNTING, and the humidity counting value HUMIDITY_COUNTING, and additionally store the total counting value TOTAL_COUNTING in the second area of the nonvolatile memory 19.

Furthermore, when entering a preset operation mode after the second time point that the DIMM 10 is collected from a user by a fabricator, the access circuit 210 may output all counting values stored in the second area of the nonvolatile memory 19, i.e. the temperature counting value TEMP_COUNTING, the power counting value POWER_ COUNTING, the humidity counting value HUMIDITY_ COUNTING, and the total counting value TOTAL_COUNTING, through the preset pin 21 of the one or more dummy pins 21 and 24.

Figure 3:
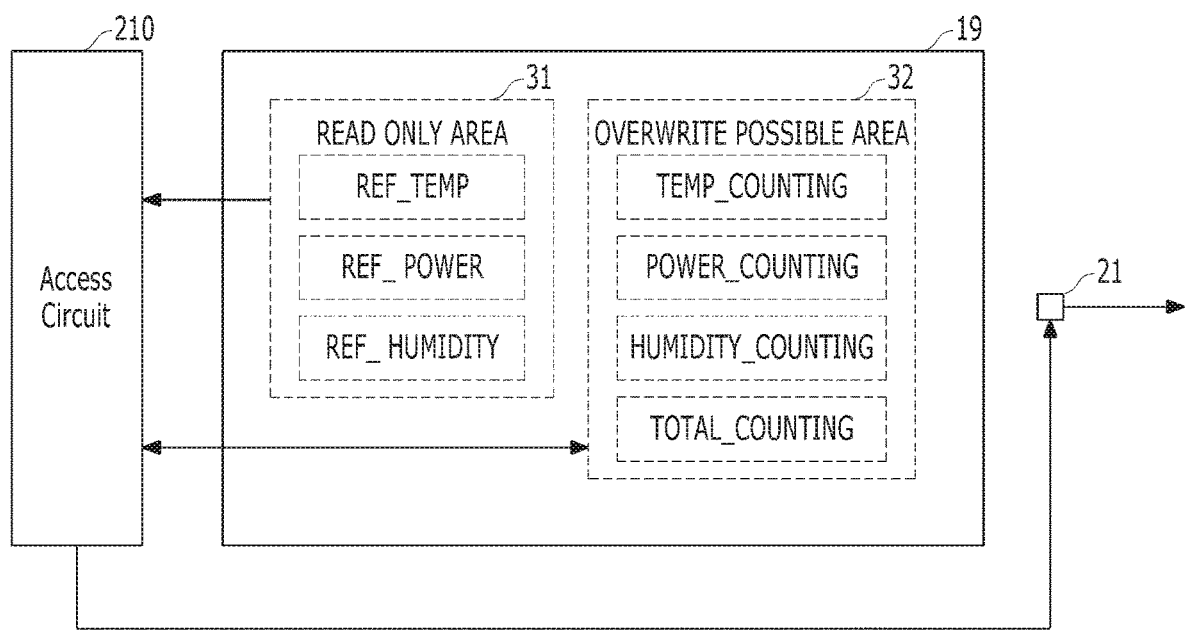
FIG. 3 is a block diagram for describing an example of a nonvolatile memory included in the DIMM illustrated in FIG. 1 in accordance with an embodiment of the present disclosure.

FIG. 3 is a block diagram for describing an example of the nonvolatile memory included in the DIMM illustrated in FIG. 1 in accordance with an embodiment of the present disclosure.

Referring to FIG. 3, the nonvolatile memory 19 may include two areas 31 and 32, i.e., a first area 31 and a second area 32.

The first area 31 may be a read only area where the reference value REF_TEMP, REF_POWER, and REF_HUMIDITY decided through a test cannot be modified (overwritten) but can be only read, after the reference value REF_TEMP, REF_POWER, and REF_HUMIDITY was written once at the point of time that the DIMM 10 including the nonvolatile memory 19 was fabricated.

In an embodiment, one or more of the reference temperature value REF_TEMP, the reference power value REF_POWER, and the reference humidity value REF_HUMIDITY may be stored in the first area 31 of the nonvolatile memory 19.

The second area 32 may be an overwrite possible area where the control circuit 20 can read the excess counting value TEMP_COUNTING, POWER_COUNTING, and HUMIDITY_COUNTING after the initial value of the excess counting value TEMP_COUNTING, POWER_COUNTING, and HUMIDITY_COUNTING was written at the point of time that the DIMM 10 including the nonvolatile memory 19 was fabricated, and can modify (overwrite) the increased excess counting value TEMP_ COUNTING, POWER_COUNTING, and HUMIDITY_ COUNTING, whenever the counter 203, 206 and 209 included in the control circuit 20 increases the excess counting value TEMP_COUNTING, POWER_COUNTING, and HUMIDITY_COUNTING.

In an embodiment, one or more of the temperature counting value TEMP_COUNTING, the power counting value POWER_COUNTING, and the humidity counting value HUMIDITY_COUNTING may be stored in the second area 32 of the nonvolatile memory 19.

In another embodiment, the total counting value TOTAL_COUNTING and two or more of the temperature counting value TEMP_COUNTING, the power counting value POWER_COUNTING, and the humidity counting value HUMIDITY_COUNTING may be stored in the second area 32 of the nonvolatile memory 19. At this time, the total counting value TOTAL_COUNTING may be a counting value obtained by summing up two or more of the temperature counting value TEMP_COUNTING, the power counting value POWER_COUNTING, and the humidity counting value HUMIDITY_COUNTING.

Furthermore, when entering a preset operation mode after the second time point that the DIMM 10 is collected from a user by a fabricator, the access circuit 210 may read all counting values stored in the second area 32 of the nonvolatile memory 19, i.e. the temperature counting value TEMP_COUNTING, the power counting value POWER_COUNTING, the humidity counting value HUMIDITY_COUNTING, and the total counting value TOTAL_COUNTING, and output the read values through the preset pin 21 of the one or more dummy pins 21 and 24.

Figure 4A:
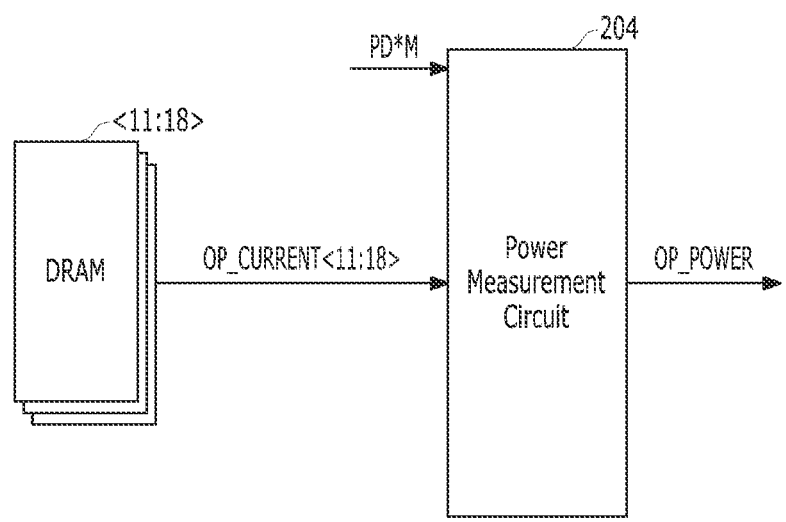
FIGS. 4A and 4B are block diagrams for describing an embodiment of a power measurement circuit among components of the control circuit illustrated in FIG. 2 in accordance with an embodiment of the present disclosure.
Figure 4B:
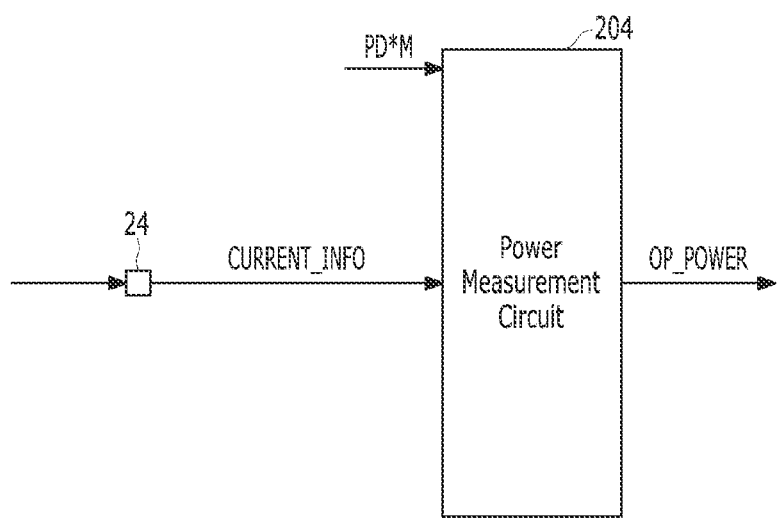

FIGS. 4A and 4B are block diagrams for describing an embodiment of the power measurement circuit among the components of the control circuit illustrated in FIG. 2 in accordance with an embodiment of the present disclosure.

FIGS. 4A and 4B illustrate an operating method of the power measurement circuit 204 in accordance with an embodiment, when the reference power value REF_POWER is included in the reference value, the operation power value OP_POWER is included in the operation value, and thus the power measurement circuit 204 for generating the operation power value OP_POWER, the power comparison circuit 205 for generating the power signal POWER_SIG, and the power counter 206 for generating the power counting value POWER_COUNTING are included in the control circuit 20 as illustrated in FIG. 2.

Referring to FIG. 4A, the power measurement circuit 204 included in the control circuit 20 may measure currents OP_CURRENT<11:18> used for the respective operations of the one or more volatile memories 11 to 18 included in the DIMM 10, and then calculate the entire operation power value OP_POWER of the DIMM 10 through the measured currents OP_CURRENT<11:18>.

In particular, the power measurement circuit 204 may measure the currents OP_CURRENT<11:18> used for the respective operations of the one or more volatile memories 11 to 18 included in the DIMM 10, in each M multiples of the preset period (PD*M), and then calculate the entire operation power value OP_POWER of the DIMM 10 through the measured currents OP_CURRENT<11:18>.

For reference, the method in which the one or more volatile memories 11 to 18 included in the DIMM 10 generate the operation currents OP_CURRENT<11:18> and provide the generated operation currents to the power measurement circuit 204 included in the control circuit 20 may be defined as a method pre-arranged during the process of fabricating the DIMM 10. Furthermore, since the one or more volatile memories 11 to 18 included in the DIMM 10 and the power measurement circuit 204 included in the control circuit 20 may be all products which are fabricated by the fabricator, the presence and operation of the power measurement circuit 204 may not be open to a user.

Referring to FIG. 4B, the power measurement circuit 204 included in the control circuit 20 may analyze information CURRENT_INFO of operation current applied from the outside through the specific input pin 24 of the one or more dummy pins 21 and 24 included in the DIMM 10, and then calculate the operation power value OP_POWER through the analyzed current information.

In particular, the power measurement circuit 204 may analyze the information CURRENT_INFO of operation current applied from the outside through the specific input pin 24 of the one or more dummy pins 21 and 24 included in the DIMM 10, in each M multiples of the preset period (PD*M), and then calculate the operation power value OP_POWER through the analyzed current information.

For reference, in order that the information CURRENT_INFO is applied to the DIMM 10 through the specific input pin 24 from the outside after the first time point that the DIMM 10 is delivered to a user, a device (e.g., memory controller or host) for controlling the DIMM 10 after the first time point needs to be able to generate the information CURRENT_INFO and transmit the generated information CURRENT_INFO to the DIMM 10. At this time, the method in which the device for controlling the DIMM 10 generates the information CURRENT_INFO and provides the generated information CURRENT_INFO to the power measurement circuit 204 included in the control circuit 20 may be predefined in the specification during the process of fabricating the DIMM 10. Therefore, the device for controlling the DIMM 10 may generate and transmit the information CURRENT_INFO with reference to the specification. That is, the presence and operation of the power measurement circuit 204 may be open to a user.

Figure 5:
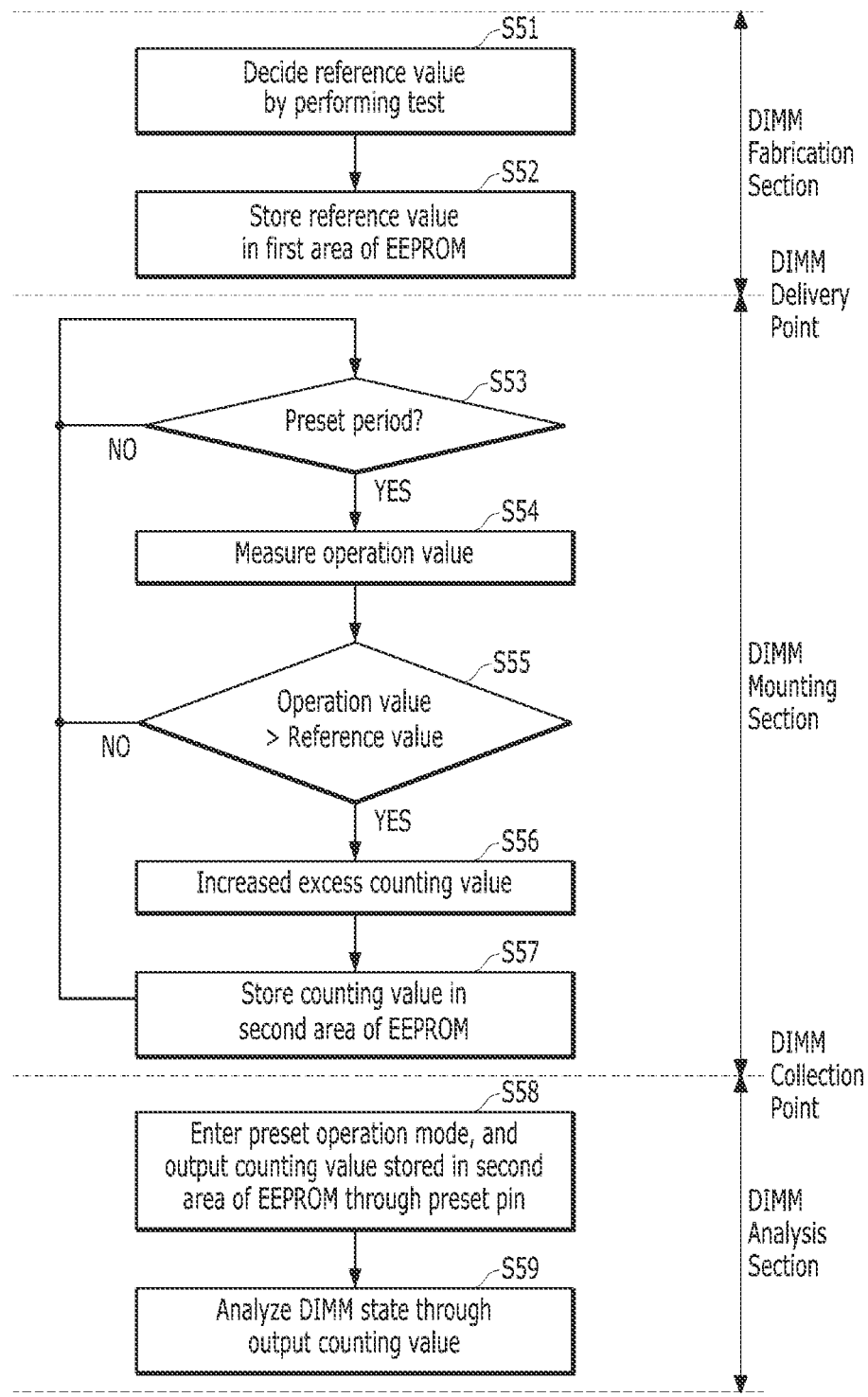
FIG. 5 is a flowchart for describing an operation of the DIMM illustrated in FIG. 1 in accordance with an embodiment of the present disclosure.

FIG. 5 is a flowchart for describing an operation of the DIMM illustrated in FIG. 1 in accordance with an embodiment of the present disclosure.

Referring to FIG. 5, the operation of the DIMM 10 may be roughly divided into three sections. That is, the operation of the DIMM 10 may be divided into a DIMM fabrication section S51 and S52, a DIMM mounting section S53 to S57, and a DIMM analysis section S58 and S59.

First, the DIMM fabrication section S51 and S52 may indicate a section before the DIMM 10 is fabricated and delivered by a fabricator.

The DIMM mounting section S53 to S57 may indicate a section in which the DIMM 10 is mounted and used by a user, after the DIMM 10 fabricated by the fabricator is delivered to the user.

The DIMM analysis section S58 and S59 may indicate a section in which the state of the DIMM 10 is analyzed after the DIMM 10 mounted and used by the user is collected by the fabricator.

Specifically, the DIMM fabrication section S51 and S52 may include deciding a reference value by performing a test on the DIMM 10, in operation S51.

When the reference value is decided in operation S51, the decided value may be stored in the first area of the nonvolatile memory 19 included in the DIMM 10, in operation S52.

When the reference value is stored in the first area of the nonvolatile memory 19 included in the DIMM 10, in operation S52, the fabricator may deliver the DIMM 10 to a user.

After the DIMM 10 fabricated through the DIMM fabrication section S51 and S52 is delivered to the user, the DIMM 10 may be mounted and used by the user. That is, the DIMM mounting section S53 to S57 may start.

Specifically, when the DIMM 10 delivered to the user is mounted and used in the DIMM mounting section S53 to S57, an operation clock CLK may toggle. Therefore, the control circuit 20 included in the DIMM 10 may determine whether a preset period has arrived on the basis of the number of times that the operation clock CLK toggles, in operation S53.

When it is determined in operation S53 that the preset period has not arrived (NO in step S53), the control circuit 20 may wait until the preset period arrives.

When it is determined in operation S53 that the preset period has arrived (YES in step S53), the control circuit 20 may measure an operation value in operation S54.

When the operation value measured in operation S54 is less than the reference value stored in the first area of the nonvolatile memory 19 (NO in operation S54), the control circuit 20 may wait until the next period arrives.

When the operation value measured in operation S54 is greater than the reference value stored in the first area of the nonvolatile memory 19 (YES in operation S54), the control circuit 20 may cumulatively count the number of times that the operation value exceeds the reference value, in operation S56.

The excess counting value obtained in operation S56 may be stored in the second area of the nonvolatile memory 19 in operation S57.

When the operation value measured in operation S54 is greater than the reference value stored in the first area of the nonvolatile memory 19 (YES in operation S54), the control circuit 20 may read the excess counting value stored in the second area of the nonvolatile memory 19, and then increase the read counting value, in operation S56.

The increased excess counting value in operation S56 may be overwritten to the second area of the nonvolatile memory 19 in operation S57. That is, the value obtained by cumulatively counting the number of times that the operation value exceeds the reference value may be stored in the second area of the nonvolatile memory 19.

When the DIMM 10 is collected by the fabricator after the DIMM mounting section S53 to S57, the DIMM analysis section S58 and S59 of the DIMM 10 may start.

Specifically, the fabricator may allow the DIMM 10 to enter a preset operation mode, such that the excess counting value stored in the second area of the nonvolatile memory 19 is outputted through the preset pin 21 of the one or more dummy pins 21 and 24 included in the DIMM 10, in operation S58 of the analysis section S58 and S59.

That is, the fabricator may receive the excess counting value, stored in the second area of the nonvolatile memory 19 included in the DIMM 10 which has been mounted and sufficiently used, through the preset pin 21, in operation S58. The fabricator may check to which operation environment the DIMM 10 has been exposed while mounted and used, through the excess counting value received in operation S58, and analyze the state of the DIMM 10 according to the) check result, in operation S59.

Although various embodiments have been described for illustrative purposes, it will be apparent to those skilled in the art that various changes and modifications may be made without departing from the spirit and scope of the invention as defined in the following claims. Furthermore, the embodiments may be combined to form additional embodiments.

What is claimed is:
1. A Dual In-line Memory Module (DIMM) comprising:
one or more volatile memories;
a nonvolatile memory having a first area where a reference value of a parameter, which is expected to reduce a life expectancy of the volatile memory by a preset range or longer, is stored and a second area where an excess counting value is stored; and a control circuit suitable for measuring an operation value of the parameter, generating the excess counting value by counting a number of times that the measured operation value exceeds the reference value, and outputting the excess counting value stored in the second area to the outside through a preset pin in a preset operation mode, wherein the reference value comprises one or more of a reference temperature value, a reference power value, and a reference humidity value, wherein the operation value comprises one or more of an operation temperature value, an operation power value, and an operation humidity value, and wherein the excess counting value comprises one or more of a temperature counting value, a power counting value, and a humidity counting value, wherein the control circuit performs two or more of:

an operation of generating the temperature counting value by counting a number of times that the operation temperature value exceeds the reference temperature value;

an operation of generating the power counting value by counting a number of times that the operation power value exceeds the reference power value; and an operation of generating the humidity counting value by counting a number of times that the operation humidity value exceeds the reference humidity value, and wherein the control circuit suitable for overwriting two of more the temperature counting value, the power counting value and the humidity counting value to the second area, generating a total counting value by summing up two or more of the temperature counting value, the power counting value, and the humidity counting value, and additionally storing the total counting value in the second area.

2. The DIMM of claim 1, wherein the control circuit comprises:

an operation measurement circuit suitable for measuring the operation value in each preset period;

a parameter comparison circuit suitable for comparing the operation value and the reference value;

a counter suitable for increasing the excess counting value stored in the second area in response to a signal outputted from the parameter comparison circuit; and an access circuit suitable for:

reading the reference value stored in the first area, transferring the read reference value to the parameter comparison circuit, reading the excess counting value stored in the second area, transferring the read excess counting value to the counter, and overwriting, into the second area, the excess counting value increased by the counter.

3. The DIMM of claim 2, wherein the operation measurement circuit comprises one or more of:

a temperature measurement circuit suitable for measuring the operation temperature value in each of N multiples of the preset period;

a power measurement circuit suitable for measuring the operation power value in each of M multiples of the preset period; and a humidity measurement circuit suitable for measuring the operation humidity value in each of K multiples of the preset period, and wherein each of N, M and K is a natural number equal to or greater than 1.

4. The DIMM of claim 3, wherein the parameter comparison circuit comprises one or more of:

a temperature comparison circuit suitable for generating a temperature signal which toggles when the measured operation temperature value exceeds the reference temperature value;

a power comparison circuit suitable for generating a power signal which toggles when the measured operation power value exceeds the reference power value; and a humidity comparison circuit suitable for generating a humidity signal which toggles when the measured operation humidity value exceeds the reference humidity value.

5. The DIMM of claim 4, wherein the access circuit performs one or more of:

an operation of reading the reference temperature value from the first area and transferring the read reference temperature value to the temperature comparison circuit;

an operation of reading the reference power value from the first area and transferring the read reference power value to the power comparison circuit; and an operation of reading the reference humidity value from the first area and transferring the read reference humidity value to the humidity comparison circuit.

6. The DIMM of claim 5, wherein the counter comprises one or more of:

a temperature counter suitable for increasing the temperature counting value in response to the toggling of the temperature signal;

a power counter suitable for increasing the power counting value in response to the toggling of the power signal; and a humidity counter suitable for increasing the humidity counting value in response to the toggling of the humidity signal.

7. The DIMM of claim 6, wherein the access circuit further performs one or more of:

an operation of reading the temperature counting value from the second area, transferring the read temperature counting value to the temperature counter, and overwriting the increased temperature counting value to the second area;

an operation of reading the power counting value from the second area, transferring the read power counting value to the power counter, and overwriting the increased power counting value to the second area; and an operation of reading the humidity counting value from the second area, transferring the read humidity counting value to the humidity counter, and overwriting the increased humidity counting value to the second area.

8. The DIMM of claim 3, wherein the power measurement circuit measures the operation power value by measuring a current required for an operation of each of the one or more volatile memories in each of M multiples of the preset period, and calculating the operation power value through the measured current.

9. The DIMM of claim 3, wherein the preset period is defined by a number of times that an operation clock toggles, and wherein the operation clock toggles in a normal mode and does not toggle in a sleep mode.

10. An operating method of a Dual In-line Memory Module (DIMM) which includes one or more volatile memories and a nonvolatile memory, the operating method comprising:

storing a reference value of a parameter decided through a test performed at a first time point, in a first area of the nonvolatile memory;

measuring, after the first time point, an operation value of the parameter in each preset period until a second time point;

storing an excess counting value in a second area of the nonvolatile memory, the excess counting value being obtained by counting a number of times that the measured operation value exceeds the reference value; and outputting the excess counting value stored in the second area to the outside through a preset pin in an operation mode set after the second time point, wherein the reference value comprises one or more of a reference temperature value, a reference power value, and a reference humidity value, wherein the operation value comprises one or more of an operation temperature value, an operation power value, and an operation humidity value, and wherein the excess counting value comprises one or more of a temperature counting value, a power counting value, and a humidity counting value, wherein the measuring of the operation value comprises performing two or more of:

generating the temperature counting value by counting a number of times that the operation temperature value exceeds the reference temperature value;

generating the power counting value by counting a number of times that the operation power value exceeds the reference power value; and generating the humidity counting value by counting a number of times that the operation humidity value exceeds the reference humidity value, and wherein the measuring of the operation value further comprises:

overwriting two of more the temperature counting value, the power counting value and the humidity counting value to the second area;

generating a total counting value by summing up two or more of the temperature counting value, the power counting value, and the humidity counting value; and additionally storing the total counting value in the second area.

11. The operating method of claim 10,
wherein the measuring of the operation value comprises performing one or more of:
measuring the operation temperature value in each of N multiples of the preset period;
measuring the operation power value in each of M multiples of the preset period; and
measuring the operation humidity value in each of K multiples of the preset period, and
wherein each of N, M and K is a natural number equal to or greater than 1.

12. The operating method of claim 11, wherein the measuring of the operation value further comprises one or more of:

generating a temperature signal which toggles when the measured operation temperature value exceeds the reference temperature value;

generating a power signal which toggles when the measured operation power value exceeds the reference power value; and generating a humidity signal which toggles when the measured operation humidity value exceeds the reference humidity value.

13. The operating method of claim 12,
wherein the measuring of the operation value further comprises one or more of
increasing the temperature counting value, which is read from the second area in response to the toggling of the temperature signal, and then overwriting the increased temperature counting value to the second area;
increasing the power counting value, read from the second area in response to the toggling of the power signal, and then overwriting the increased power counting value to the second area; and
increasing the humidity counting value, read from the second area in response to the toggling of the humidity signal, and then overwriting the increased humidity counting value to the second area.

14. The operating method of claim 11, wherein the measuring of the operation power value comprises:
measuring a current required for an operation of each of the one or more volatile memories in each of M multiples of the preset period; and
calculating the operation power value through the measured current.

15. The operating method of claim 11, wherein the measuring of the operation power value comprises:
analyzing information of operation current applied from the outside through a specific input pin; and
calculating the operation power value through the analyzed information.

16. The operating method of claim 11,
wherein the preset period is defined by a number of times that an operation clock toggles, and
wherein the operation clock toggles in a normal mode and does not toggle in a sleep mode.

* * * * *